(12) United States Patent
Cankurt (10) Patent No.: US 7,564,380 B2
(45) Date of Patent: Jul. 21, 2009

(54) SYSTEMS AND METHODS FOR STORING TEST DATA AND ACCESSING TEST DATA

(75) Inventor: Nurettin Tevfik Cankurt, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 175 days.

(21) Appl. No.: 11/832,824

(22) Filed: Aug. 2, 2007

(65) Prior Publication Data

US 2009/0037640 A1 Feb. 5, 2009

(51) Int. Cl.
*H03M 7/00* (2006.01)

(52) U.S. Cl. ............... 341/90; 711/100; 714/704; 717/124

(58) Field of Classification Search ............ 341/50–95; 711/100; 714/19, 704, 724, 718, 38, 42; 717/124, 127, 719
See application file for complete search history.

(56) References Cited

U.S. PATENT DOCUMENTS

| | | | |
|---|---|---|---|
| 5,467,458 A * | 11/1995 | Takeda et al. | 711/100 |
| 6,536,004 B2 * | 3/2003 | Pierce et al. | 714/719 |
| 6,931,357 B2 | 8/2005 | Richard et al. | |
| 7,113,883 B1 * | 9/2006 | House et al. | 702/122 |
| 7,173,839 B2 * | 2/2007 | Kim | 365/49.1 |
| 7,194,666 B1 * | 3/2007 | Wong et al. | 714/704 |

\* cited by examiner

*Primary Examiner*—Lam T Mai
(74) *Attorney, Agent, or Firm*—Cantor Colburn LLP (57) ABSTRACT

A system and a method for storing test data are provided. The system includes a memory device and a computer operably communicating with the memory device. The computer is configured to receive test data comprising various data types. The computer is further configured to convert the various data types into 8-bit characters that are stored in a character array. The character array can be stored in a memory device utilizing a single write command.

6 Claims, 9 Drawing Sheets

FIG. 5
Mapping Info

- 130 — Starting position of 8-bit characters is position 0 in character array; number of 8-bit characters is 2.
- 132 — Starting position of 16-bit integers is position 2 in character array; number of 16-bit integers is 2.
- 134 — Starting position of 32-bit integers is position 6 in character array; number of 32-bit integers is 2.
- 136 — Starting position of 32-bit floating point numbers is position 14 in character array; number of 32-bit integers is 2.
- 138 — Starting position of 64-bit floating point numbers is position 22 in character array; number of 64-bit floating point numbers is 2.

FIG. 6
Access Info

| | |
|---|---|
| Temp1 → Position 0 in Character Array | 150 |
| Temp2 → Position 1 in Character Array | 152 |
| Pressure1 → Position 2 in Character Array | 154 |
| Pressure2 → Position 4 in Character Array | 156 |
| Rpm1 → Position 6 in Character Array | 158 |
| Rpm2 → Position 10 in Character Array | 160 |
| Force1 → Position 14 in Character Array | 162 |
| Force2 → Position 18 in Character Array | 164 |
| Position1 → Position 22 in Character Array | 166 |
| Position2 → Position 30 in Character Array | 168 |

SYSTEMS AND METHODS FOR STORING TEST DATA AND ACCESSING TEST DATA

BACKGROUND

Engineering tests of multiple devices generate large quantities of data. Further, the test data is typically stored for later retrieval. A problem associated with the current systems for storing test data is that the systems are not able to efficiently store and access large quantities of test data. In particular, a separate write command is utilized to store each portion of test data in a memory device.

BRIEF DESCRIPTION OF THE INVENTION

A method of storing test data in accordance with an exemplary embodiment is provided. The method includes receiving test data comprising a first set of 8-bit characters, a plurality of 16-bit integers, a plurality of 32-bit integers, a plurality of 32-bit floating point numbers, and a plurality of 64-bit floating point numbers. The method further includes converting the plurality of 16-bit integers into a second set of 8-bit characters. The method further includes converting the plurality of 32-bit integers into a third set of 8-bit characters. The method further includes converting the plurality of 32-bit floating point numbers into a fourth set of 8-bit characters. The method further includes converting the plurality of 64-bit floating point numbers into a fifth set of 8-bit characters. The method further includes storing the first set of 8-bit characters in a first region of a character array. The method further includes storing the second set of 8-bit characters in a second region of the character array. The method further includes storing the third set of 8-bit characters in a third region of the character array. The method further includes storing the fourth set of 8-bit characters in a fourth region of the character array. The method further includes storing the fifth set of 8-bit characters in a fifth region of the character array.

A system for storing test data in accordance with another exemplary embodiment is provided. The system includes a memory device and a computer operably communicating with the memory device. The computer is configured to receive test data comprising a first set of 8-bit characters, a plurality of 16-bit integers, a plurality of 32-bit integers, a plurality of 32-bit floating point numbers, and a plurality of 64-bit floating point numbers. The computer is further configured to convert the plurality of 16-bit integers into a second set of 8-bit characters. The computer is further configured to convert the plurality of 32-bit integers into a third set of 8-bit characters. The computer is further configured to convert the plurality of 32-bit floating point numbers into a fourth set of 8-bit characters. The computer is further configured to convert the plurality of 64-bit floating point numbers into a fifth set of 8-bit characters. The computer is further configured to store the first set of 8-bit characters in a first region of a character array. The computer is further configured to store the second set of 8-bit characters in a second region of the character array. The computer is further configured to store the third set of 8-bit characters in a third region of the character array. The computer is further configured to store the fourth set of 8-bit characters in a fourth region of the character array. The computer is further configured to store the fifth set of 8-bit characters in a fifth region of the character array. The computer is further configured to write the character array to a file on the memory device.

A method of accessing stored test data in accordance with another exemplary embodiment is provided. The method includes reading a file stored on the memory device to a file has test data stored in a character array. The character array has a first set of 8-bit characters, a second set of 8-bit characters corresponding to a plurality of 16-bit integers, a third set of 8-bit characters corresponding to a plurality of 32-bit integers a fourth set of 8-bit characters corresponding to a plurality of 32-bit floating point numbers, and a fifth set of 8-bit characters corresponding to a plurality of 64-bit floating point numbers. The method further includes converting the second set of 8-bit characters into the plurality of 16-bit integers. The method further includes converting the third set of 8-bit characters into the plurality of 32-bit integers. The method further includes converting the fourth set of 8-bit characters into the plurality of 32-bit floating point numbers. The method further includes converting the fifth set of 8-bit characters into the plurality of 64-bit floating point numbers.

A system for accessing stored test data in accordance with another exemplary embodiment is provided. The system includes a memory device and a computer operably communicating with the memory device. The computer is configured to read a file stored on the memory device. The file has test data stored in a character array, the character array having a first set of 8-bit characters, a second set of 8-bit characters corresponding to a plurality of 16-bit integers, a third set of 8-bit characters corresponding to a plurality of 32-bit integers, a fourth set of 8-bit characters corresponding to a plurality of 32-bit floating point numbers, and a fifth set of 8-bit characters corresponding to a plurality of 64-bit floating point numbers. The computer is configured to convert the second set of 8-bit characters into the plurality of 16-bit integers. The computer is further configured to convert the third set of 8-bit characters into the plurality of 32-bit integers. The computer is further configured to convert the fourth set of 8-bit characters into the plurality of 32-bit floating point numbers. The computer is further configured to convert the fifth set of 8-bit characters into the plurality of 64-bit floating point numbers.

DETAILED DESCRIPTION OF EXEMPLARY EMBODIMENTS

Figure 1:
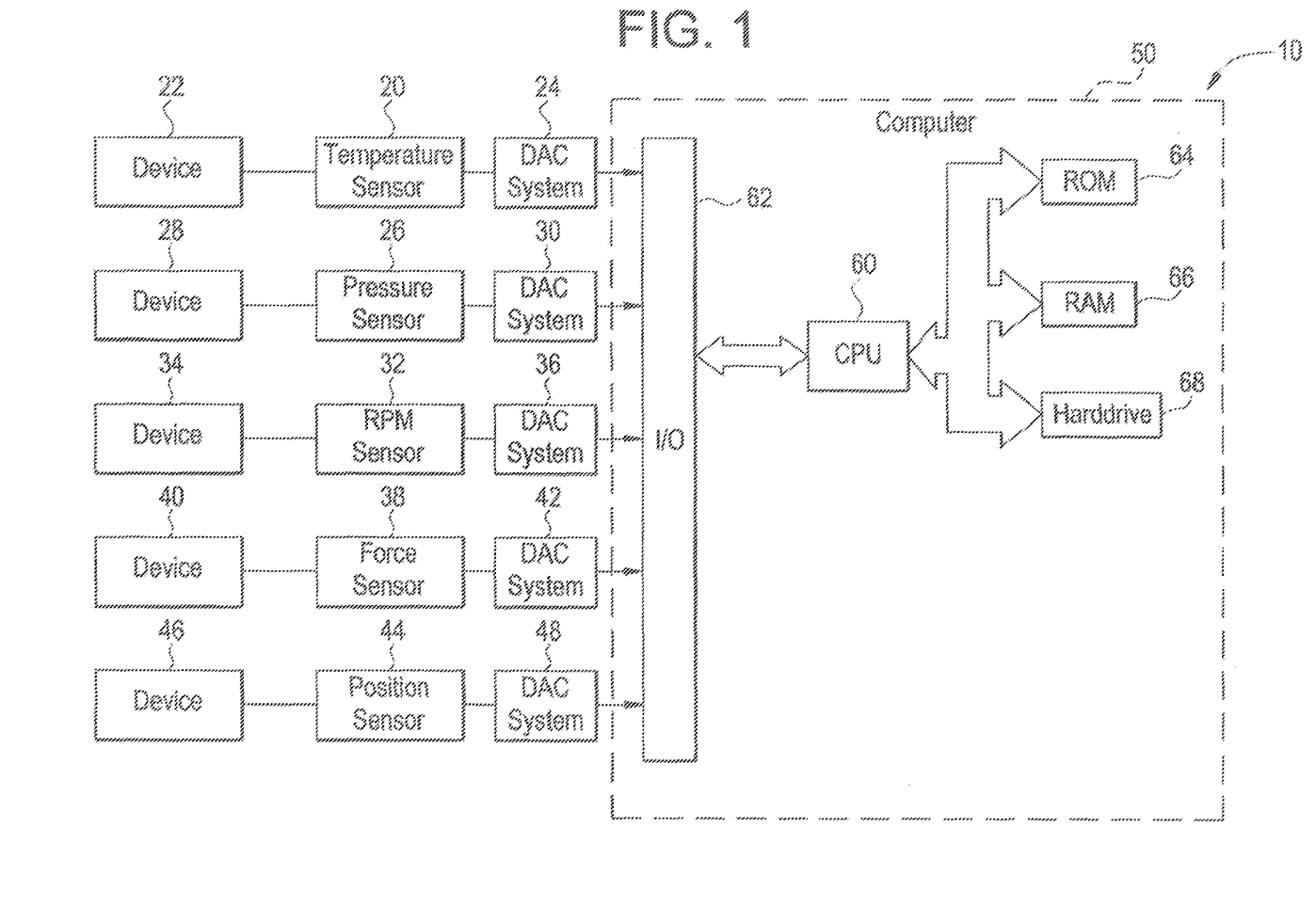
FIG. 1 is a schematic of a system for storing test data and accessing test data in accordance with an exemplary embodiment.

Referring to FIG. 1, a system for storing test data and accessing stored test data in accordance with an exemplary embodiment is illustrated. The system includes a temperature sensor 20, a device 22, a data acquisition system 24, a pressure sensor 26, a device 28, a data acquisition system 30, an RPM sensor 32, a device 34, a data acquisition system 36, a force sensor 38, a device 40, a data acquisition system 42, a position sensor 44, a device 46, a data acquisition system 48, and a computer 50. A substantial advantage of the system 10 is that the system stores test data as 8-bit characters in a character array which allows the data to be efficiently stored in a memory device and retrieved from the memory device. It should be noted that FIG. 1 illustrates an exemplary system 10 for storing test data and accessing stored test data. In alternative embodiments, other types of sensors, data acquisition systems, or devices could be utilized. Further, the format (e.g., 8-bit character, 16-bit integer, 32-bit integer, 32-bit floating point number, 64-bit floating point number) of test data from specific data acquisition systems and an amount of the received test data can also vary from that disclosed herein as known by the skilled in the art.

The temperature sensor 20 is configured to generate a signal indicative of a temperature of the device 22 that is received by the data acquisition system 24. The temperature sensor 20 is operably coupled to the device 22 and operably communicates with the data acquisition system 24. The data acquisition system 24 is configured to receive the signal from the temperature sensor 20 and to generate a variable having a value indicative of an amplitude or frequency of the signal. For example, in one exemplary embodiment, the data acquisition system 24 can receive the signal from the temperature sensor 20 and generate test data comprising a variable "temp1" having an 8-bit character indicative of an amplitude of the signal. The data acquisition system 24 transmits the generated variable to the computer 50 via an I/O interface 62.

The pressure sensor 26 is configured to generate a signal indicative of a pressure associated with the device 28 that is received by the data acquisition system 30. The pressure sensor 26 is operably coupled to the device 28 and operably communicates with the data acquisition system 30. The data acquisition system 30 is configured to receive the signal from the pressure sensor 26 and to generate a variable having a value indicative of an amplitude or frequency of the signal. For example, in one exemplary embodiment, the data acquisition system 30 can receive the signal from the pressure sensor 26 and generate test data comprising a variable "pressure1" having a 16-bit integer indicative of an amplitude of the signal. The data acquisition system 30 transmits the generated variable to the computer 50 via the I/O interface 62.

The RPM sensor 32 is configured to generate a signal indicative of an RPM of the device 34 that is received by the data acquisition system 36. The RPM sensor 32 is operably coupled to the device 34 and operably communicates with the data acquisition system 36. The data acquisition system 36 is configured to receive the signal from the RPM sensor 32 and to generate a variable having a value indicative of an amplitude or frequency of the signal. For example, in one exemplary embodiment, the data acquisition system 36 can receive the signal from the RPM sensor 32 and generate test data comprising a variable "RPM I" having a 32-bit integer indicative of an amplitude of the signal. The data acquisition system 36 transmits the generated variable to the computer 50 via the I/O interface 62.

The force sensor 38 is configured to generate a signal indicative of a force associated with the device 40 that is received by the data acquisition system 42. The force sensor 38 is operably coupled to the device 40 and operably communicates with the data acquisition system 42. The data acquisition system 42 is configured to receive the signal from the force sensor 38 and to generate a variable having a value indicative of an amplitude or frequency of the signal. For example, in one exemplary embodiment, the data acquisition system 42 can receive the signal from the force sensor 38 and generate test data comprising a variable "force1" having a 32-bit floating point number indicative of an amplitude of the signal. The data acquisition system 42 transmits the generated variable to the computer 50 via the I/O interface 62.

The position sensor 44 is configured to generate a signal indicative of a position of the device 46 that is received by the data acquisition system 48. The position sensor 44 is operably coupled to the device 46 and operably communicates with the data acquisition system 48. The data acquisition system 48 is configured to receive the signal from the position sensor 44 and to generate a variable having a value indicative of an amplitude or frequency of the signal. For example, in one exemplary embodiment, the data acquisition system 48 can receive the signal from the position sensor 44 and generate test data comprising a variable "position1" having a 64-bit floating point number indicative of an amplitude of the signal. The data acquisition system 48 transmits the generated variable to the computer 50 via the I/O interface 62.

The computer 50 is provided to receive test data from the data acquisition systems 24, 30, 36; 42, 48 and to execute software routines to store the test data in a format on a memory device that can be efficiently stored and retrieved. The computer 50 includes a central processing unit (CPU) 60, a read-only memory (ROM) 64, a volatile memory such as a random access memory (RAM) 66, a hard drive 68 and the I/O interface 62. The CPU 60 operably communicates with the ROM 64, the RAM 66, the hard drive 68 and the I/O interface 62. During operation, the computer 50 stores generated test data in the hard-drive 68 and retrieves stored test data from the hard-drive 68.

Figure 2:
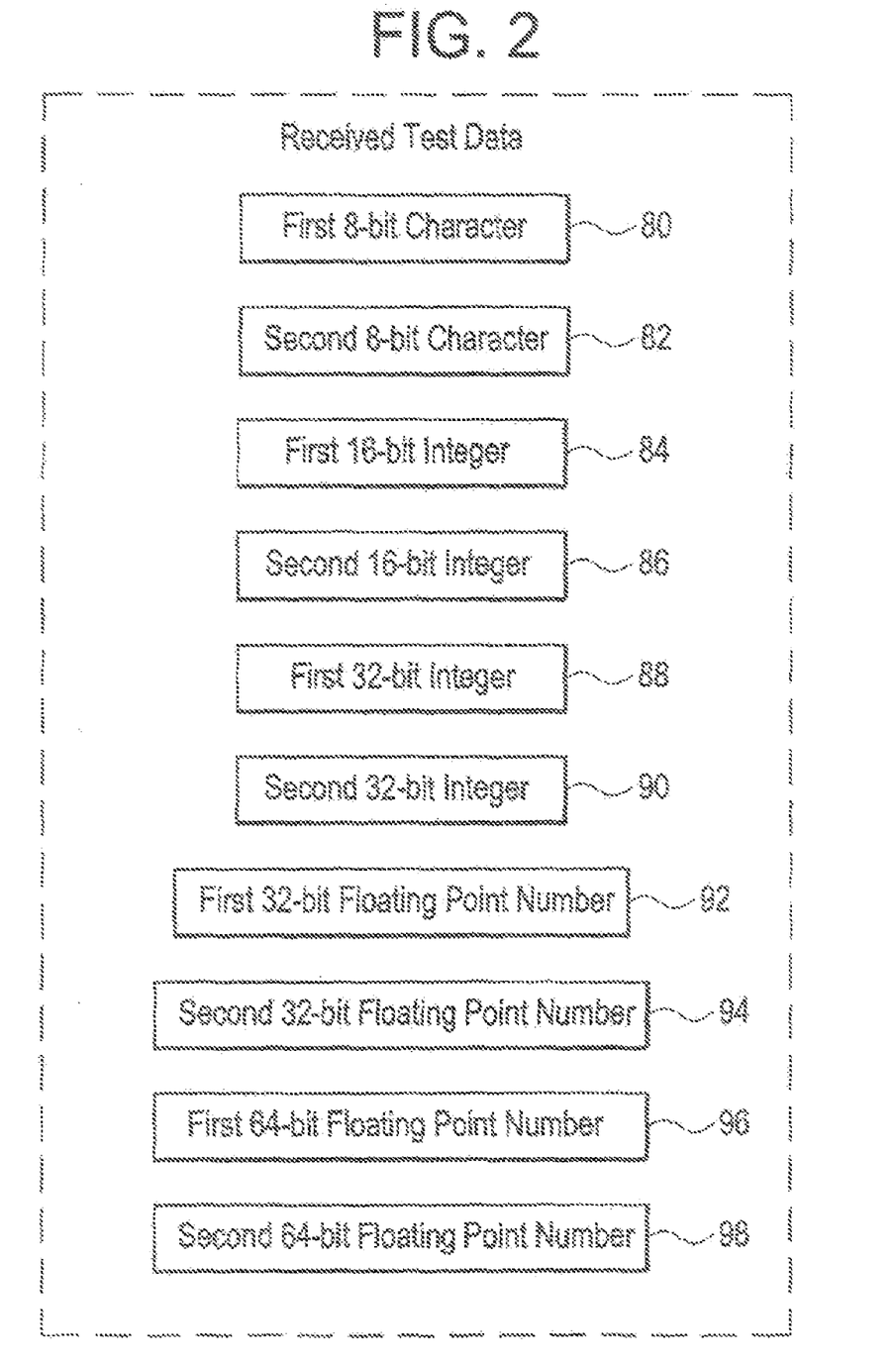
FIG. 2 is a schematic of exemplary test data that can be received by the system of FIG. 1.

Before providing a detailed explanation of the operation of system 10, a brief description of exemplary test data that can be received by the computer 50 will be explained. Referring to FIG. 2, the computer 50 can receive the following test data: (i) an 8-bit character 80, (ii) an 8-bit character 82, (iii) a 16-bit integer 84, (iv) a 16-bit integer 86, (v) a 32-bit integer 88, (vi) a 32-bit integer 90, (viii) a 32-bit floating point number 92, (ix) a 32-bit floating point number 94, (x) a 64-bit floating point number 96, and (xi) a 64-bit floating point number 98. It should be noted that the foregoing test data is exemplary test data and that a plurality of additional values could be received by the computer 50 during operation.

Figure 3:
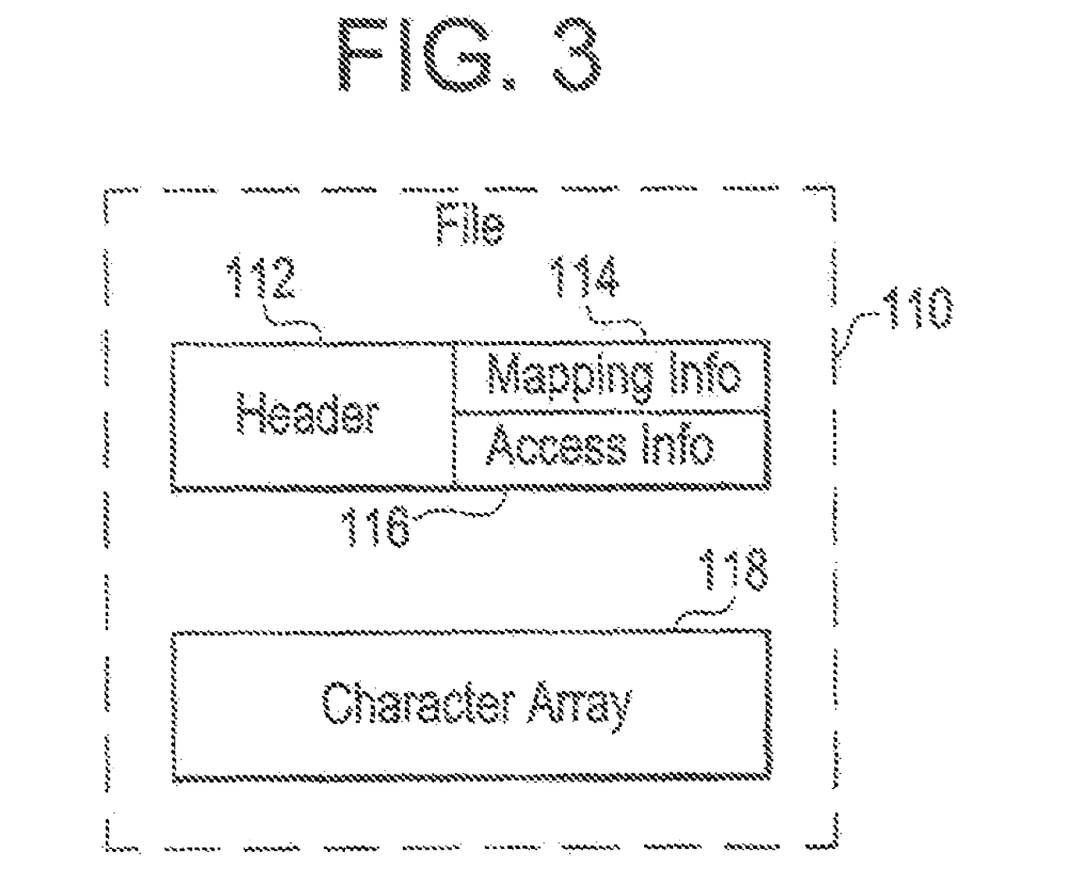
FIG. 3 is a schematic of a file having a header and a character array utilized to store test data.

Referring to FIG. 3, a file 110 utilized by the computer 50 will now be explained. During operation, the computer 50 generates the file 110 which includes a header 112, mapping information 114, access information 116, and a character array 118. The computer 50 receives test data and converts the test data into 8-bit characters which are organized and stored within the character array 118. Further, the computer 50 can write the file 110 to the hard-drive 68 and read the file 110 from the hard-drive 68.

Figure 4:
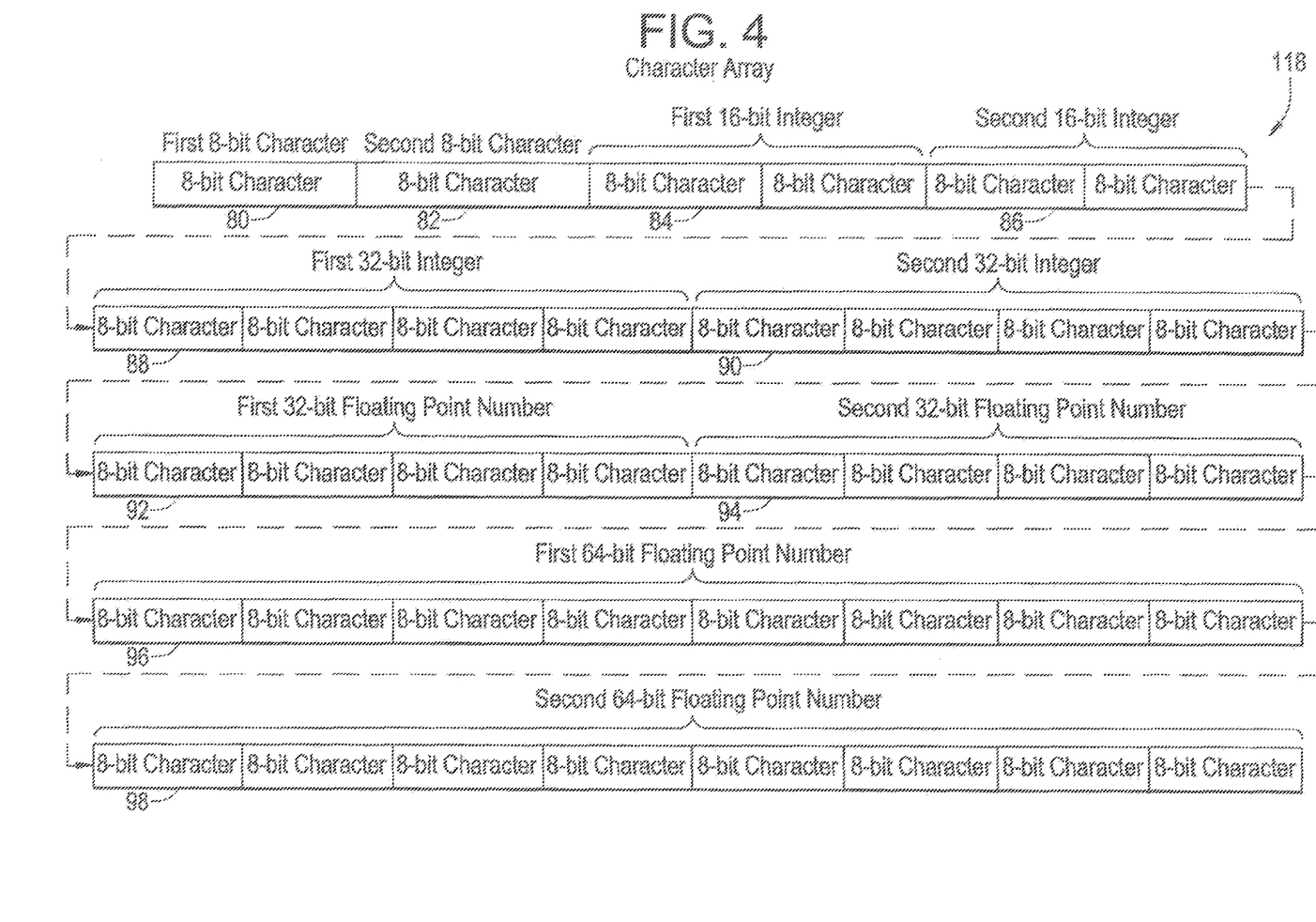
FIG. 4 is a detailed schematic of the character array of FIG. 3.

Referring to FIG. 4, the computer 50 receives test data comprising 8-bit characters and stores the 8-bit characters in a first region of the character array 118. For example, the computer 50 can receive the 8-bit characters 80, 82 and store the 8-bit characters 80, 82 in positions (0 and 1), respectively of the character array 118.

The computer 50 receives test data comprising 16-bit integers and converts each 16-bit integer into two 8-bit characters. Further, the computer 50 stores the 8-bit characters corresponding to each 16-bit integer in a second region of the character array 118. For example, the computer 50 can receive the 16-bit integer 84 and convert the 16-bit integer 84 into two 8-bit characters that are stored at positions (2 and 3) in the character array 118. The computer 50 can further receive the 16-bit integer 86 and convert the 16-bit integer 86 into two 8-bit characters that are stored at positions (4 and 5) in the character array 118.

The computer 50 receives test data comprising 32-bit integers and converts each 32-bit integer into four 8-bit characters. Further, the computer 50 stores the 8-bit characters corresponding to each 32-bit integer in a third region of the character array 118. For example, the computer 50 can receive the 32-bit integer 88 and convert the 32-bit integer 88 into four 8-bit characters that are stored at positions (6, 7, 8, 9) in the character array 118. The computer 50 can further receive the 32-bit integer 90 and convert the 32-bit integer 90 into four 8-bit characters that are stored at positions (10, 11, 12, 13) in the character array 118.

The computer 50 receives test data comprising 32-bit floating point numbers and converts each 32-bit floating point number into four 8-bit characters. Further, the computer 50 stores the 8-bit characters corresponding to each 32-bit floating point number in a fourth region of the character array 118. For example, the computer 50 can receive the 32-bit floating point number 92 and convert the 32-bit floating point number 92 into four 8-bit characters that are stored at positions (14, 15, 16, 17) in the character array 118. The computer 50 can further receive the 32-bit floating point number 94 and convert the 32-bit floating point number 94 into four 8-bit characters that are stored at positions (18, 19, 20, 21) in the character array 118.

The computer 50 receives test data comprising 64-bit floating point numbers and converts each 64-bit floating point number into eight 8-bit characters. Further, the computer 50 stores the 8-bit characters corresponding to each 64-bit floating point number in a fifth region of the character array 118. For example, the computer 50 can receive the 64-bit floating point number 96 and convert the 64-bit floating point number 96 into eight 8-bit characters that are stored at positions (22, 23, 24, 25, 26, 27, 28, 29) in the character array 118. The computer 50 can further receive the 64-bit floating point number 98 and convert the 64-bit floating point number 98 into eight 8-bit characters that are stored at positions (30, 31, 32, 33, 34, 35, 36, 37) in the character array 118.

Figure 5:
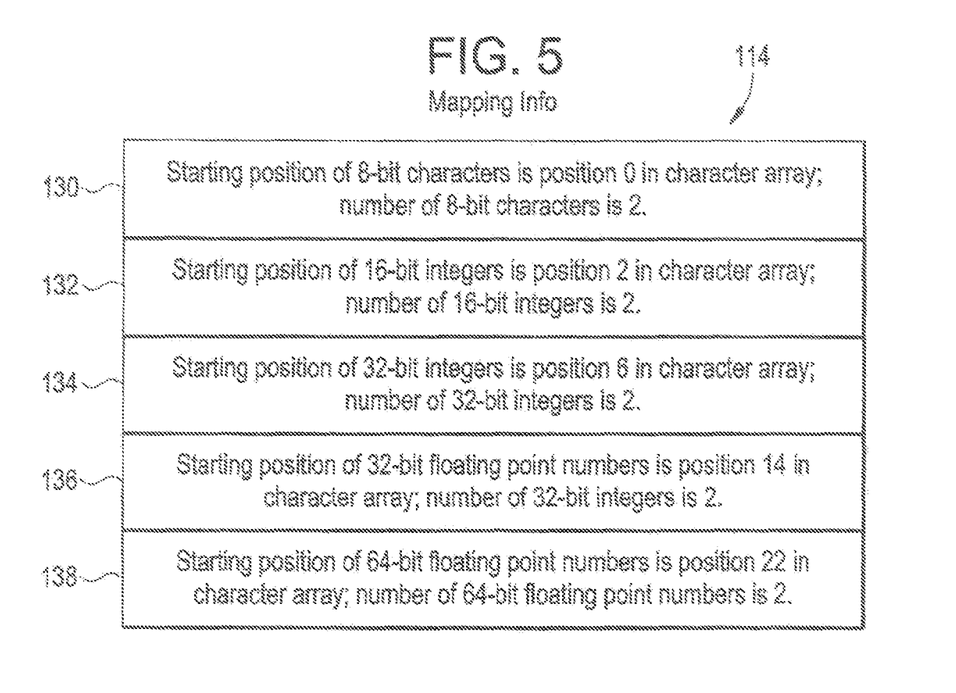
FIG. 5 is a schematic of exemplary mapping information contained within the header of FIG. 3.

Referring to FIGS. 3 and 5, exemplary mapping information 114 contained within the file 110 will now be explained. The mapping information 114 is provided to indicate regions within the character array 118 where various data types are stored for subsequent retrieval of the test data in the character array 118. In particular, the mapping information 114 indicates storage locations in the character array 118 corresponding to (i) 8-bit characters, (ii) 16-bit integers, (iii) 32-bit integers, (iv) 32-bit floating point numbers, and (v) 64-bit floating point numbers. As shown, the mapping information 114 includes data portions 130, 132, 134, 136, 138. The data portion 130 indicates that a starting position of 8-bit characters is at position (0) in the character array 118 and that the number of 8-bit characters is equal to "2." The data portion 132 indicates that a starting position of 16-bit integers is at position (2) in the character array 118 and that the number of 16-bit integers is equal to "2." The data portion 134 indicates that a starting position of 32-bit integers is at position (6) in the character array 118 and that the number of 32-bit integers is equal to "2." The data portion 136 indicates that a starting position of 32-bit floating point numbers is at position (14) in the character array 118 and that the number of 32-bit floating point numbers is equal to "2." The data portion 138 indicates that a starting position of 64-bit floating point numbers is at position (22) in the character array 118 and that the number of 64-bit floating point numbers is equal to "2."

Figure 6:
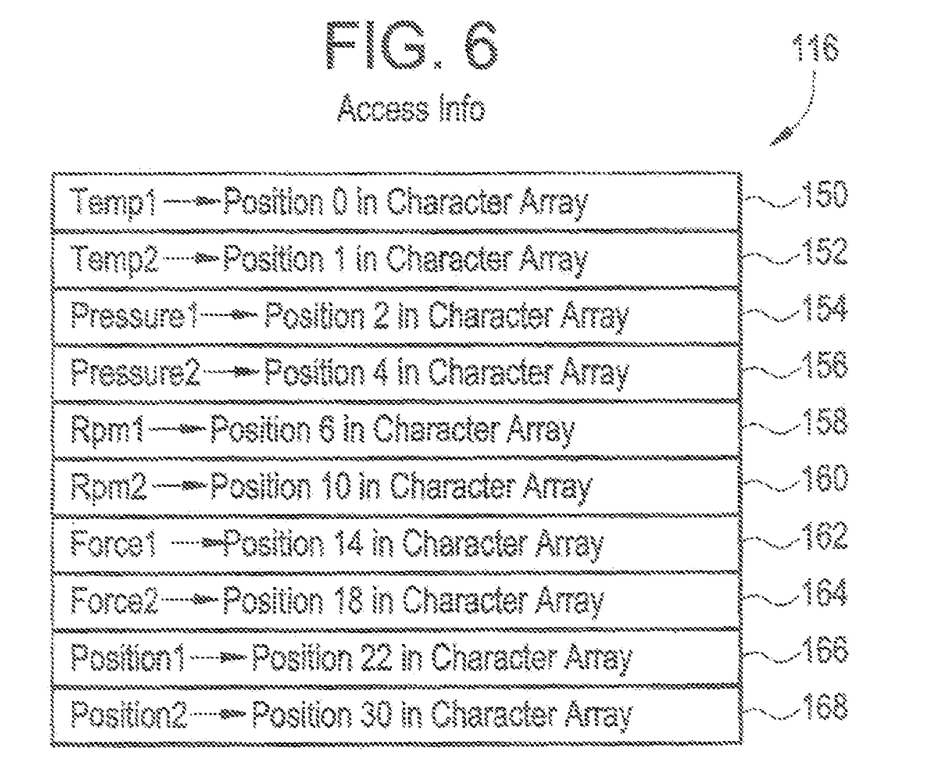
FIG. 6 is a schematic of exemplary access information contained within the header of FIG. 3.

Referring to FIGS. 3 and 6, exemplary access information 116 contained within the file 110 will now be explained. The access information 116 is provided to indicate received variable names and associated positions in the character array 118 where character values associated with the variable names are stored. In particular, the access information 116 includes data portions 150, 152, 154, 156, 158, 160, 162, 164, 166, 168. The data portion 150 indicates that a variable name "temp1" has associated data stored at position (0) in the character array 118. The data portion 152 indicates that a variable name "temp2" has associated data stored at position (1) in the character array 118. The data portion 154 indicates that a variable name "pressure1" has associated data stored at position (2) in the character array 118. The data portion 156 indicates that a variable name "pressure2" has associated data stored at position (4) in the character array 118. The data portion 158 indicates that a variable name "rpm1" has associated data stored at position (6) in the character array 118. The data portion 160 indicates that a variable name "rpm2" has associated data stored at position (10) in the character array 118. The data portion 162 indicates that a variable name "force1" has associated data stored at position (14) in the character array 118. The data portion 164 indicates that a variable name "force2" has associated data stored at position (18) in the character array 118. The data portion 166 indicates that a variable name "position1" has associated data stored at position (22) in the character array 118. The data portion 168 indicates that a variable name "position2" has associated data stored at position (30) in the character array 118.

Figure 7:
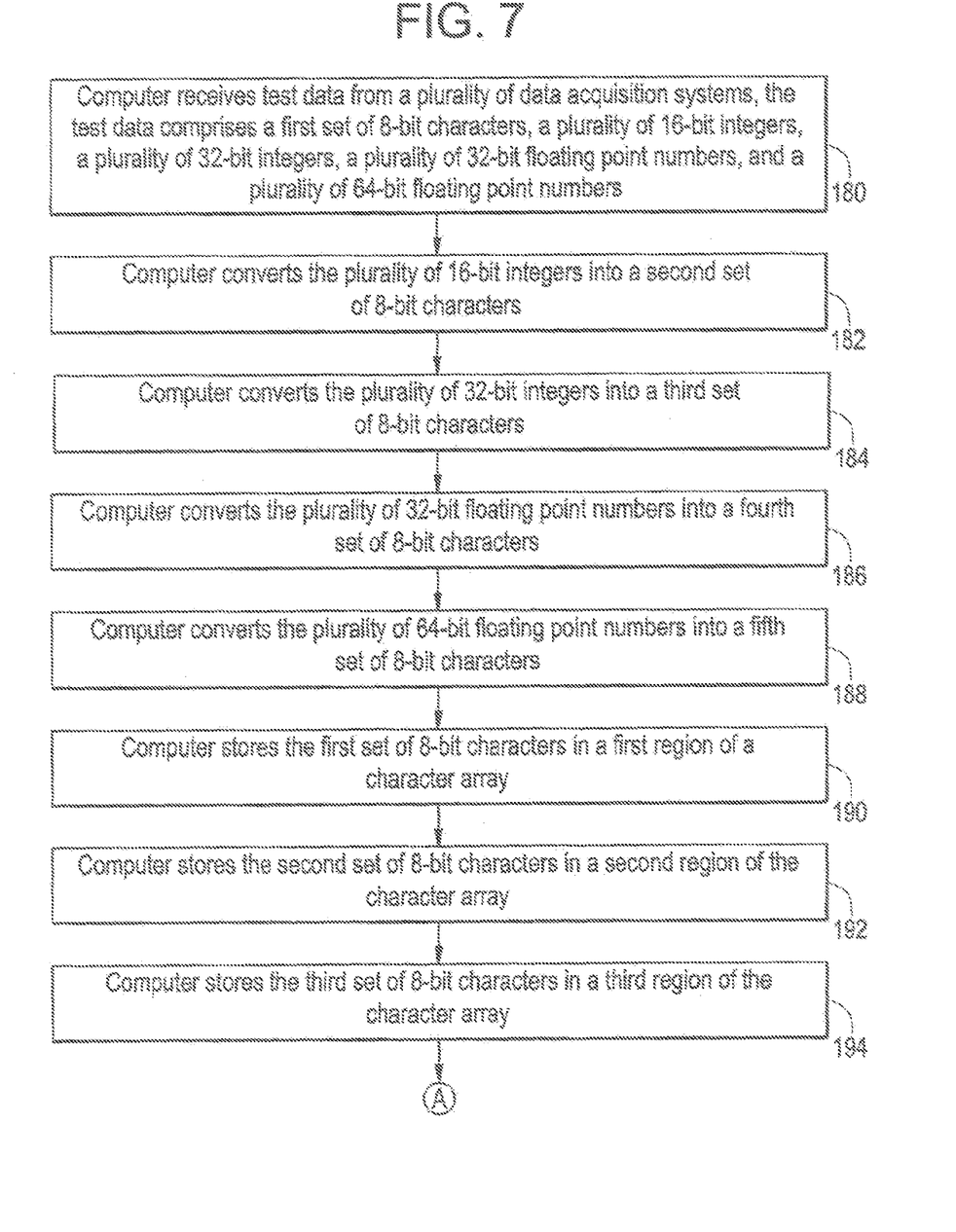
FIGS. 7-8 are flowcharts of a method for storing test data in accordance with another exemplary embodiment.
Figure 8:
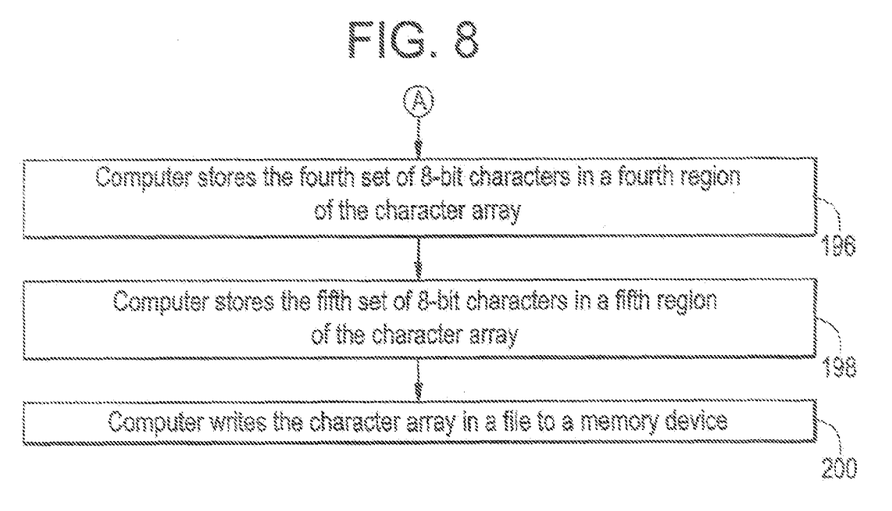

Referring to FIGS. 7-8, a flowchart of a method for storing test data in accordance with an exemplary embodiment will now be explained.

At step 180, the computer 50 receives test data from a plurality of data acquisition systems. The test data comprises a first set of 8-bit characters, a plurality of 16-bit integers, a plurality of 32-bit integers, a plurality of 32-bit floating point numbers, and a plurality of 64-bit floating point numbers.

At step 182, the computer 50 converts the plurality of 16-bit integers into a second set of 8-bit characters.

At step 184, the computer 50 converts the plurality of 32-bit integers into a third set of 8-bit characters.

At step 186, the computer 50 converts the plurality of 32-bit floating point numbers into a fourth set of 8-bit characters.

At step 188, the computer 50 converts the plurality of 64-bit floating point numbers into a fifth set of 8-bit characters.

At step 190, the computer 50 stores the first set of 8-bit characters in a first region of a character array 118.

At step 192, the computer 50 stores the second set of 8-bit characters in a second region of the character array 118.

At step 194, the computer 50 stores the third set of 8-bit characters in a third region of the character array 118.

At step 196, the computer 50 stores the fourth set of 8-bit characters in a fourth region of the character array 118.

At step 198, the computer 50 stores the fifth set of 8-bit characters in a fifth region of the character array 118.

At step 200, the computer 50 writes the character array 118 in the file 110 to the memory device 68.

Figure 9:
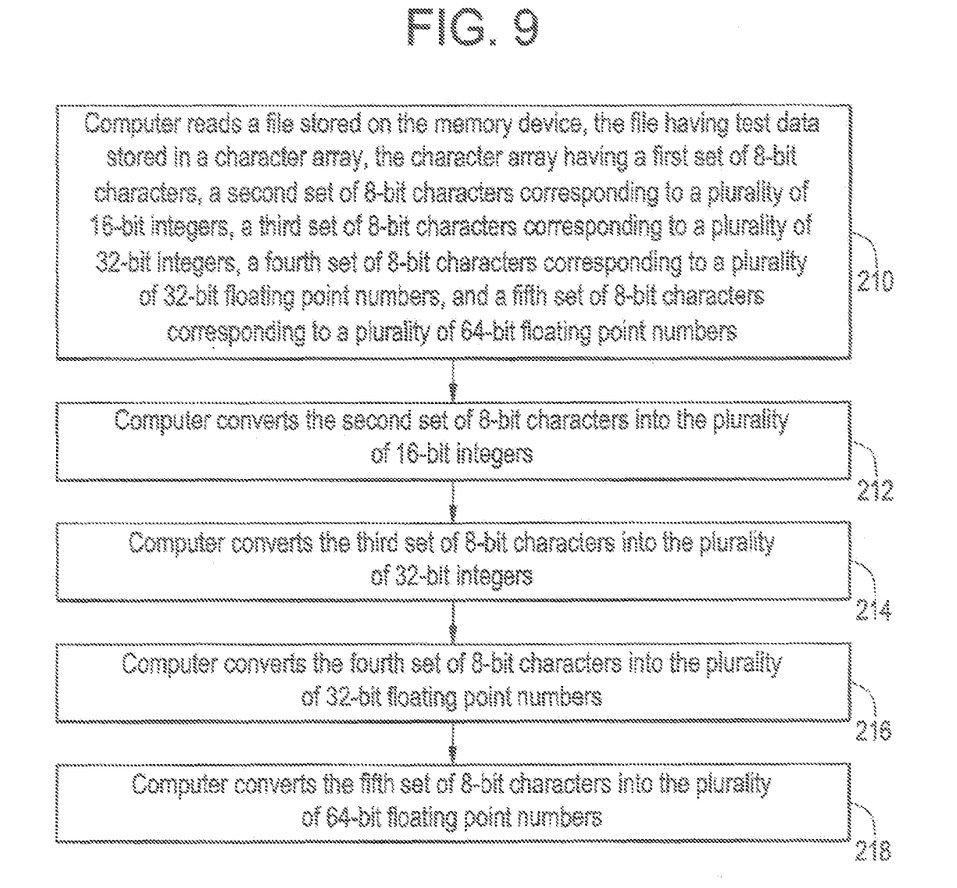
FIG. 9 is a flowchart of a method for accessing stored test data in accordance with another exemplary embodiment.

Referring to FIG. 9, a flowchart of a method for retrieving stored test data in accordance with another exemplary embodiment will now be explained.

At step 210, the computer 50 reads the file 110 stored on the memory device 68. The file 110 has test data stored in the character array 118. That character array 118 has a first set of 8-bit characters, a second set of 8-bit characters corresponding to a plurality of 16-bit integers, a third set of 8-bit characters corresponding to a plurality of 32-bit integers, a fourth set of 8-bit characters corresponding to a plurality of 32-bit floating point numbers, and a fifth set of 8-bit characters corresponding to a plurality of 64-bit floating point numbers.

At step 212, the computer 50 converts the second set of 8-bit characters into the plurality of 16-bit integers.

At step 214, the computer 50 converts the third set of 8-bit characters into the plurality of 32-bit integers.

At step 216, the computer 50 converts the fourth set of 8-bit characters into the plurality of 32-bit floating point numbers.

At step 218, the computer 50 converts the fifth set of 8-bit characters into the plurality of 64-bit floating point numbers.

The system and method for storing test data and retrieving stored test data provide a substantial advantage over other system and methods. In particular, these embodiments provide a technical effect of converting various types of test data into 8-bit characters that are stored in a character array for efficient storage and retrieval of the test data. In particular, a plurality of test data values in the character array can be stored in a memory device utilizing a reduced number of write commands to the memory device. For example, a single write command could be utilized to write the character array to the memory device depending on the total number of characters in the character array. Further, the plurality of test data values can be subsequently retrieved from the memory device utilizing a reduced number of read commands to the memory device. For example, a single read command could be utilized to read the character array from the memory device depending on the total number of characters in the character array.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention.

While the invention is described with reference to exemplary embodiments, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiments disclosed for carrying out this invention, but that the invention includes all embodiments falling with the scope of the intended claims. Moreover, the use of the terms first, second, etc. does not denote any order of importance, but rather the terms first, second, etc. are used to distinguish one element from another.

What is claimed is:

1. A method of storing test data, comprising:
receiving test data comprising a first set of 8-bit characters, a plurality of 16-bit integers, a plurality of 32-bit integers, a plurality of 32-bit floating point numbers, and a plurality of 64-bit floating point numbers;
converting the plurality of 16-bit integers into a second set of 8-bit characters;
converting the plurality of 32-bit integers into a third set of 8-bit characters;
converting the plurality of 32-bit floating point numbers into a fourth set of 8-bit characters;
converting the plurality of 64-bit floating point numbers into a fifth set of 8-bit characters;
storing the first set of 8-bit characters in a first region of a character array;
storing the second set of 8-bit characters in a second region of the character array;
storing the third set of 8-bit characters in a third region of the character array;
storing the fourth set of 8-bit characters in a fourth region of the character array; and
storing the fifth set of 8-bit characters in a fifth region of the character array.

2. The method of claim 1, further comprising writing the character array to a file on a memory device.

3. A system for storing test data, comprising:
a memory device; and
a computer operably communicating with the memory device, the computer configured to receive test data comprising a first set of 8-bit characters, a plurality of 16-bit integers, a plurality of 32-bit integers, a plurality of 32-bit floating point numbers, and a plurality of 64-bit floating point numbers;
the computer further configured to convert the plurality of 16-bit integers into a second set of 8-bit characters;
the computer further configured to convert the plurality of 32-bit integers into a third set of 8-bit characters;
the computer further configured to convert the plurality of 32-bit floating point numbers into a fourth set of 8-bit characters;
the computer further configured to convert the plurality of 64-bit floating point numbers into a fifth set of 8-bit characters;
the computer further configured to store the first set of 8-bit characters in a first region of a character array;
the computer further configured to store the second set of 8-bit characters in a second region of the character array;
the computer further configured to store the third set of 8-bit characters in a third region of the character array;
the computer further configured to store the fourth set of 8-bit characters in a fourth region of the character array;
the computer further configured to store the fifth set of 8-bit characters in a fifth region of the character array; and
the computer further configured to write the character array to a file on the memory device.

4. The system of claim 3, further comprising a plurality of data acquisition systems operably communicating with the computer, the plurality of data acquisition systems configured to send the test data to the computer.

5. A method of accessing stored test data, comprising:
reading a file stored on the memory device, the file having test data stored in a character array, the character array having a first set of 8-bit characters, a second set of 8-bit characters corresponding to a plurality of 16-bit integers, a third set of 8-bit characters corresponding to a plurality of 32-bit integers, a fourth set of 8-bit characters corresponding to a plurality of 32-bit floating point numbers, and a fifth set of 8-bit characters corresponding to a plurality of 64-bit floating point numbers;
converting the second set of 8-bit characters into the plurality of 16-bit integers;
converting the third set of 8-bit characters into the plurality of 32-bit integers;
converting the fourth set of 8-bit characters into the plurality of 32-bit floating point numbers; and
converting the fifth set of 8-bit characters into the plurality of 64-bit floating point numbers.

6. A system for accessing stored test data, comprising:
a memory device;
a computer operably communicating with the memory device, the computer configured to read a file stored on the memory device, the file having test data stored in a character array, the character array having a first set of 8-bit characters, a second set of 8-bit characters corresponding to a plurality of 16-bit integers, a third set of 8-bit characters corresponding to a plurality of 32-bit integers, a fourth set of 8-bit characters corresponding to a plurality of 32-bit floating point numbers, and a fifth set of 8-bit characters corresponding to a plurality of 64-bit floating point numbers;

the computer further configured to convert the second set of 8-bit characters into the plurality of 16-bit integers;

the computer further configured to convert the third set of 8-bit characters into the plurality of 32-bit integers;

the computer further configured to convert the fourth set of 8-bit characters into the plurality of 32-bit floating point numbers; and the computer further configured to convert the fifth set of 8-bit characters into the plurality of 64-bit floating point numbers.

* * * * *